US012571824B2

(12) United States Patent
Brown

(10) Patent No.: US 12,571,824 B2
(45) Date of Patent: Mar. 10, 2026

(54) METHOD AND SYSTEM FOR MONITORING IMPEDANCE IN A CONDUCTOR

(71) Applicant: HELLA GMBH & CO. KGAA, Lippstadt (DE)

(72) Inventor: Alan Wayne Brown, Canton, MI (US)

(73) Assignee: HELLA GMBH & CO. KGAA, Lippstadt (DE)

( * ) Notice: Subject to any disclaimer, the term of this patent is extended or adjusted under 35 U.S.C. 154(b) by 187 days.

(21) Appl. No.: 18/417,374

(22) Filed: Jan. 19, 2024

(65) Prior Publication Data

US 2025/0237685 A1     Jul. 24, 2025

(51) Int. Cl.
| *G01R 27/20* | (2006.01) |
| *G01R 27/08* | (2006.01) |
| *H02H 7/12* | (2006.01) |

(52) U.S. Cl.
CPC ............ *G01R 27/20* (2013.01); *G01R 27/08* (2013.01); *H02H 7/1203* (2013.01)

(58) Field of Classification Search
CPC .... G01R 31/52; G01R 31/50; G01R 31/3842; G01R 31/389; G01R 27/08; G01R 27/16; G01R 27/18; G01R 27/20; G01R 31/08; G01R 33/1246; H02H 7/1203; H02H 1/04; H02H 1/00; H02H 5/105; H02H 1/0015

See application file for complete search history.

(56) References Cited

U.S. PATENT DOCUMENTS

| 6,091,591 A | 7/2000 | Heinz et al. | |
| 6,392,422 B1 * | 5/2002 | Kammer | H02H 1/06 |
| | | | 324/509 |

| 7,843,197 B2 * | 11/2010 | Finlay, Sr. | G01R 35/00 |
| | | | 324/424 |
| 9,637,010 B2 * | 5/2017 | Merienne | B60L 3/0069 |
| 11,275,102 B2 | 3/2022 | Broeckmann | |
| (Continued) | | | |

FOREIGN PATENT DOCUMENTS

| CN | 205970917 U | 2/2017 |
| CN | 107985089 A | 5/2018 |
| (Continued) | | |

OTHER PUBLICATIONS

International Search Report of the International Searching Authority for Application No. PCT/EP2025/050091, mailed May 7, 2025 (2 pages).

*Primary Examiner* — Vinh P Nguyen
(74) *Attorney, Agent, or Firm* — WARNER NORCROSS + JUDD LLP

(57) ABSTRACT

A method for monitoring the line impedance of a protective earth ("PE") conductor is provided. The method injects a small stimulus current at a frequency much higher than the grid frequency. The stimulus current circulates in the loops between a grid-connected device and a grid source, creating small voltage drops in the grid conductors, resulting in a common mode voltage which can be measured. The method then includes measuring the common mode voltage and the residual current at a point of common coupling ("PCC"). The method then includes monitoring the resistive and reactive parts of the line impedance. For example, the method can monitor the line impedance and report a broken PE conductor or a high PE resistance, beyond a given threshold where safety becomes a concern.

19 Claims, 4 Drawing Sheets

(56) References Cited

U.S. PATENT DOCUMENTS

| | | | |
|---|---|---|---|
| 11,486,907 B2 | 11/2022 | Kipp et al. | |
| 11,498,442 B2 * | 11/2022 | Engel | B60L 3/0069 |
| 11,500,032 B2 * | 11/2022 | Broeckmann | G01R 15/18 |
| 2010/0039096 A1 | 2/2010 | Schwesig | |
| 2011/0273139 A1 | 11/2011 | Hofheinz | |
| 2012/0249070 A1 | 10/2012 | Sellner et al. | |
| 2012/0257315 A1 | 10/2012 | Wallmeier | |
| 2013/0258531 A1 | 10/2013 | Li et al. | |
| 2015/0077055 A1 | 3/2015 | Merienne | |
| 2017/0368951 A1 | 12/2017 | Adlhoch et al. | |
| 2018/0294642 A1 | 10/2018 | Madsen | |
| 2018/0335463 A1 | 11/2018 | Götz et al. | |
| 2019/0184849 A1 | 6/2019 | Lim | |
| 2019/0212370 A1 | 7/2019 | Kipp et al. | |
| 2019/0270382 A1 | 9/2019 | Pfizenmaier et al. | |
| 2019/0389324 A1 | 12/2019 | Koolen et al. | |
| 2020/0070677 A1 | 3/2020 | Spesser et al. | |
| 2021/0023957 A1 | 1/2021 | Linzmaier | |
| 2021/0048485 A1 | 2/2021 | Koolen et al. | |
| 2021/0063458 A1 | 3/2021 | Engel | |
| 2021/0078430 A1 | 3/2021 | Engel | |
| 2021/0096167 A1 | 4/2021 | Erk et al. | |
| 2021/0101501 A1 | 4/2021 | Neitz et al. | |
| 2021/0138923 A1 | 5/2021 | Hähre et al. | |
| 2021/0255225 A1 | 8/2021 | Broeckmann | |
| 2021/0354575 A1 | 11/2021 | Vahedi et al. | |
| 2021/0391672 A1 | 12/2021 | Van der Heijden et al. | |
| 2022/0082635 A1 | 3/2022 | Broeckmann et al. | |
| 2022/0250491 A1 | 8/2022 | Fuehrer | |

FOREIGN PATENT DOCUMENTS

| | | | |
|---|---|---|---|
| CN | 215728732 U | 2/2022 | |
| CN | 114530902 A | 5/2022 | |
| CN | 216636165 U | 5/2022 | |
| CN | 114590144 A | 6/2022 | |
| CN | 217134016 U | 8/2022 | |
| DE | 102009001962 A1 | 10/2010 | |
| DE | 102011101530 A1 | 11/2012 | |
| DE | 102011084350 A1 | 4/2013 | |
| DE | 102012200660 A1 | 5/2013 | |
| DE | 102012219457 A1 | 7/2013 | |
| DE | 102012219542 A1 | 7/2013 | |
| DE | 102013226023 A1 | 6/2015 | |
| DE | 102015216191 A1 | 3/2016 | |
| DE | 102015117678 A1 | 4/2017 | |
| DE | 102017202959 A1 | 8/2018 | |
| DE | 102017213357 B3 | 10/2018 | |
| DE | 102019109260 A1 | 10/2020 | |
| DE | 102019112839 B3 | 10/2020 | |
| DE | 102019112083 A1 | 11/2020 | |
| DE | 102019212431 B3 | 11/2020 | |
| DE | 102019207920 A1 | 12/2020 | |
| DE | 102019130165 A1 | 5/2021 | |
| DE | 102019133675 A1 | 6/2021 | |
| DE | 102020130764 A1 | 5/2022 | |
| EP | 2384922 A2 | 11/2011 | |
| EP | 2500208 A2 | 9/2012 | |
| EP | 2502778 A2 | 9/2012 | |
| EP | 2945240 A1 | 11/2015 | |
| EP | 3034350 A1 | 6/2016 | |
| EP | 3157113 A1 | 4/2017 | |
| EP | 3513205 A1 | 7/2019 | |
| EP | 3564059 A1 | 11/2019 | |
| EP | 3569441 A1 | 11/2019 | |
| EP | 3589513 A1 | 1/2020 | |
| EP | 3795407 A1 | 3/2021 | |
| EP | 3817172 A1 | 5/2021 | |
| EP | 3835798 A1 | 6/2021 | |
| EP | 3862763 A1 | 8/2021 | |
| EP | 3864732 A1 | 8/2021 | |
| EP | 3931036 A1 | 1/2022 | |
| EP | 3999372 A1 | 5/2022 | |
| ES | 1243009 U | 3/2020 | |
| KR | 20170094869 A | 8/2017 | |
| KR | 20200092624 A | 8/2020 | |
| KR | 20220020661 A | 2/2022 | |
| WO | 2021018475 A1 | 2/2021 | |
| WO | 2021156608 A1 | 8/2021 | |
| WO | 2022130010 A1 | 6/2022 | |

* cited by examiner

METHOD AND SYSTEM FOR MONITORING IMPEDANCE IN A CONDUCTOR

FIELD OF THE INVENTION

The present invention relates to electrical protection circuits for battery electric vehicles and for other applications.

BACKGROUND OF THE INVENTION

A protective earth conductor (PE conductor) is a component of an electrical circuit that is designed to provide a safe path for the dissipation of electric currents in the event of a fault. The primary role of a PE conductor is to protect persons and property from electrical shock and to prevent electrical fires. Known PE conductors include a copper or aluminum conductor that is electrically connected to a metal component of a grid-connected device. In the event of a short circuit or a breakdown in insulation, the PE conductor provides a low-resistance path for the fault current to flow safely to ground. This helps ensure that the metal parts of the grid-connected device remain at a low potential, minimizing the risk of shock.

In the context of battery electric vehicles, a suitable ground can include the metal chassis or a similar structure with a low impedance and a high current capacity. In a stationary grid-connected configuration, the battery electric vehicle (in particular, an on-board charger) is electrically connected to the PE conductor. However, a faulty PE conductor can result in an increased risk of damage to the battery electric vehicle and the risk of electrical shock to persons who may touch the battery electric vehicle. To mitigate this risk, known methods measure the resistance of the PE conductor, including both passive methods and active methods. Despite their existence, however, there remains a continued need for an improved method for monitoring the resistance of a PE conductor. In particular, there remains a continued need for an improved method and a system for the real-time monitoring of PE conductors for a wide range of electrical grids, including three-phase Y electrical systems, three-phase delta electrical systems, U.S. split phase electrical systems, and single-phase electrical systems.

SUMMARY OF THE INVENTION

An improved method for monitoring a line impedance is provided. The method generally includes: (a) applying a stimulus current to a PE conductor at a frequency that is greater than the frequency of a grid voltage; (b) measuring a common mode voltage at a point of common coupling between the grid voltage and a grid-connected device; (c) measuring a residual current at the point of common coupling; (d) determining an impedance at the point of common coupling based on the common mode voltage and the residual current, the impedance having a resistive component and a reactive component; and (e) generating an alert if the measured impedance is greater than a predetermined threshold. For example, the method can monitor the line impedance and report a faulty PE conductor, beyond a given threshold where safety becomes a concern.

In another aspect of the invention, a system is provided. The system includes a PE conductor electrically coupled to a PE terminal of a power supply and a PE terminal of an electrical load, for example a power converter of an electric vehicle. The system further includes a PE monitoring circuit for monitoring an impedance of the PE conductor. The PE monitoring circuit includes a stimulus injector that is configured to apply a stimulus current directly to the PE conductor at a frequency that is at least an order of magnitude greater than a frequency of the power supply. The PE monitoring circuit further includes a measurement circuit that is configured to measure a common mode voltage and a residual current at a point of common coupling (PCC) of the current-carrying wires extending between the power supply and the electrical load. The PE monitoring circuit further includes a processor configured to calculate the impedance of the PE conductor based on the measured common mode voltage and the measured residual current. Calculating the impedance of the PE conductor includes, in one embodiment, performing a vector divide at the stimulus frequency, wherein performing the vector divide includes a complex common mode voltage measurement divided by a complex residual current measurement.

In these and other embodiments, the method and the system inject a small stimulus current (e.g., a sinusoidal current) at a frequency much higher than the grid frequency. For a grid frequency of 50/60 Hz, for example, the stimulus current can include a frequency of between 1 kHz and 10 kHz, which does not contribute to power transfer from the grid to the grid-connected device. The stimulus current circulates in the loops between the grid-connected device and the grid source, creating small voltage drops in the grid conductors, resulting in a common mode voltage and a residual current at the PCC. For example, on a three-phase Y connection having current carrying wires L1, L2, L3, and N, each of these four lines are measured with respect to the PE conductor at the PCC. These voltages are summed together and divided by four to arrive at the vector mean voltage, also referred to as a common mode voltage. The method and the system determine the grid impedance using a vector divide at the specified injected stimulus frequency. The method and the system monitor the resistive and reactive parts of the grid impedance and can be applied to any grid-connected application, such as three-phase Y electrical systems, three-phase delta electrical systems, U.S. split phase electrical systems, and single-phase electrical systems.

These and other features and advantages of the present invention will become apparent from the following description of the invention, when viewed in accordance with the accompanying drawings and the appended claims. It will be appreciated that any of the preferred and/or optional features of the invention may be incorporated alone, or in appropriate combination, within embodiments of the invention, while still falling within the scope of claim 1, even if such combinations are not explicitly claimed in the appended claims.

DETAILED DESCRIPTION OF THE PRESENT EMBODIMENTS

Figure 1:
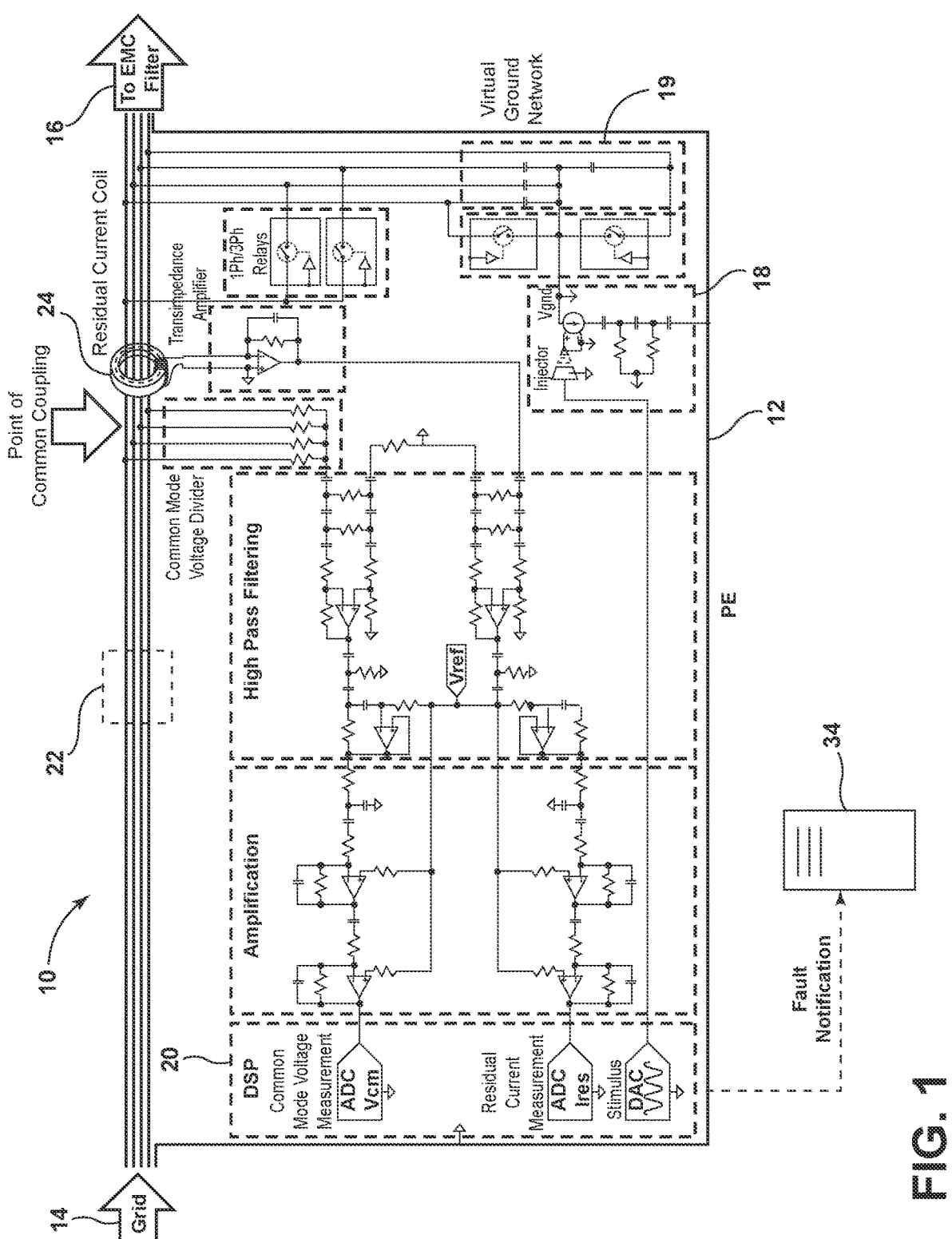
FIG. 1 is a circuit diagram of an electrical protection circuit in accordance with one embodiment of the invention.

Referring to FIG. 1, a protective earth circuit in accordance with one embodiment is illustrated and generally designated 10. The protective earth circuit 10 includes a protective earth conductor 12 that is electrically connected between a grid (mains) voltage 14 and a grid-connected device 16. As explained below, the protective earth circuit 10 includes digital circuitry and analog circuitry for actively monitoring the fidelity of the protective earth conductor 12 according to the following operations: (a) applying a stimulus current to the protective earth conductor 12 at a frequency that is greater than the frequency of the grid voltage 14; (b) measuring a common mode voltage at a point of common coupling between the grid voltage 14 and the grid-connected device 16; (c) measuring a residual current at the point of common coupling; (d) determining an impedance at the point of common coupling based on the common mode voltage and the residual current, the impedance having a resistive component and a reactive component; and (e) generating an alert if the measured impedance is greater than a predetermined threshold for the protective earth conductor 12. Each such operation is separately discussed below.

Figure 2:
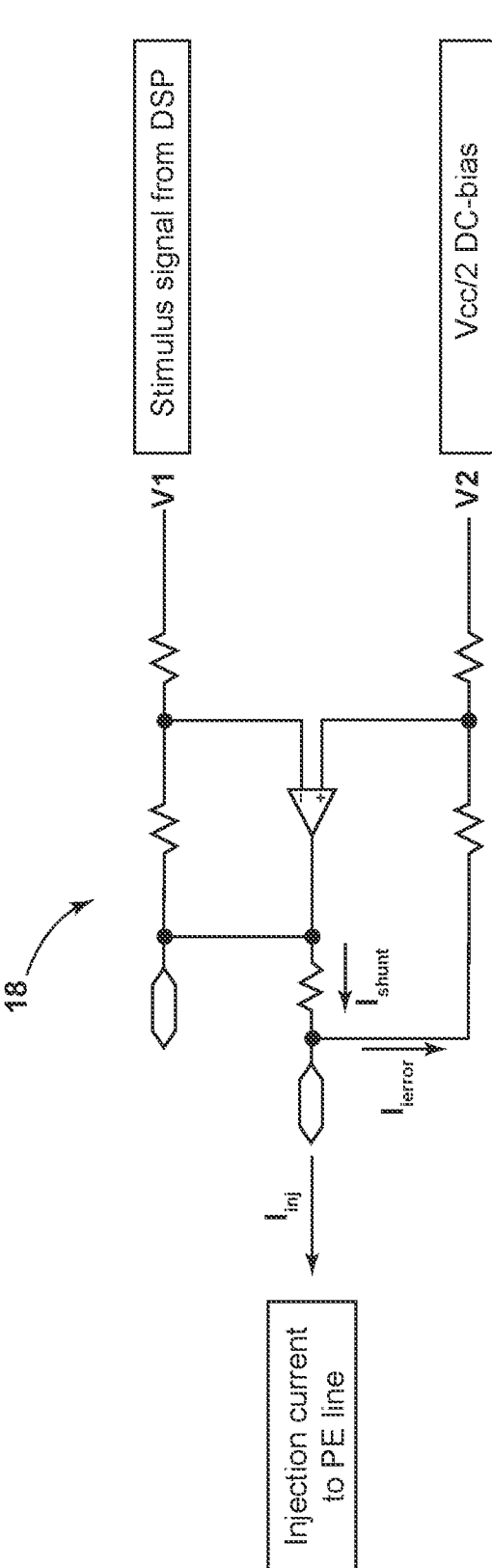
FIG. 2 is a circuit diagram of a current injector circuit for applying a stimulus current to a PE conductor.

Applying a stimulus current to the protective earth conductor 12 generally includes generating a high frequency, low voltage waveform. As shown in FIGS. 1-2, for example, a current injector 18 receives a stimulus signal from a digital signal processor (DSP) 20. The current injector 18 includes an op-amp open loop gain function for providing an injection current to the protective earth conductor 12. The injection current includes a frequency that is at least an order of magnitude greater than the grid frequency (i.e., at least 10 times greater). For a grid frequency of 50/60 Hz, for example, the stimulus current can include a sinusoidal waveform with a frequency of between 1 kHz and 10 kHz, which does not contribute to power transfer from the grid to the grid-connected device 16. The stimulus current can include a magnitude that does not disturb the system, optionally about 500 μARMS (amps root-mean-square). The stimulus current circulates in the loops between the grid source 14 and the grid-connected device 16, creating small voltage drops in the grid conductors 22, resulting in a common mode voltage and a residual current which can be measured. In the illustrated embodiment, the grid conductors 22 include four current carrying wires L1, L2, L3, and N for a three-phase Y connection. In other embodiments, however, the grid conductors 16 can include fewer current carrying wires as appropriate for three-phase delta electrical systems, U.S. split phase electrical systems, and/or single-phase electrical systems.

As also shown in FIG. 1, a virtual ground network 19 is used as a return path for the current injector 18. The virtual ground network 19 provides a path for the stimulus current to return to the current injector 18. As also shown in FIG. 1, the current injector 18 is coupled to the virtual ground network 19 (e.g., the virtual ground node Vend) and to the protective earth conductor 12. The virtual ground network 19 includes a plurality of capacitors that act as an averaging circuit, such that the virtual ground node (Vgnd) is close to the potential of the protective earth conductor 12, thus allowing a low voltage to inject into the protective earth conductor 12.

Figure 3:
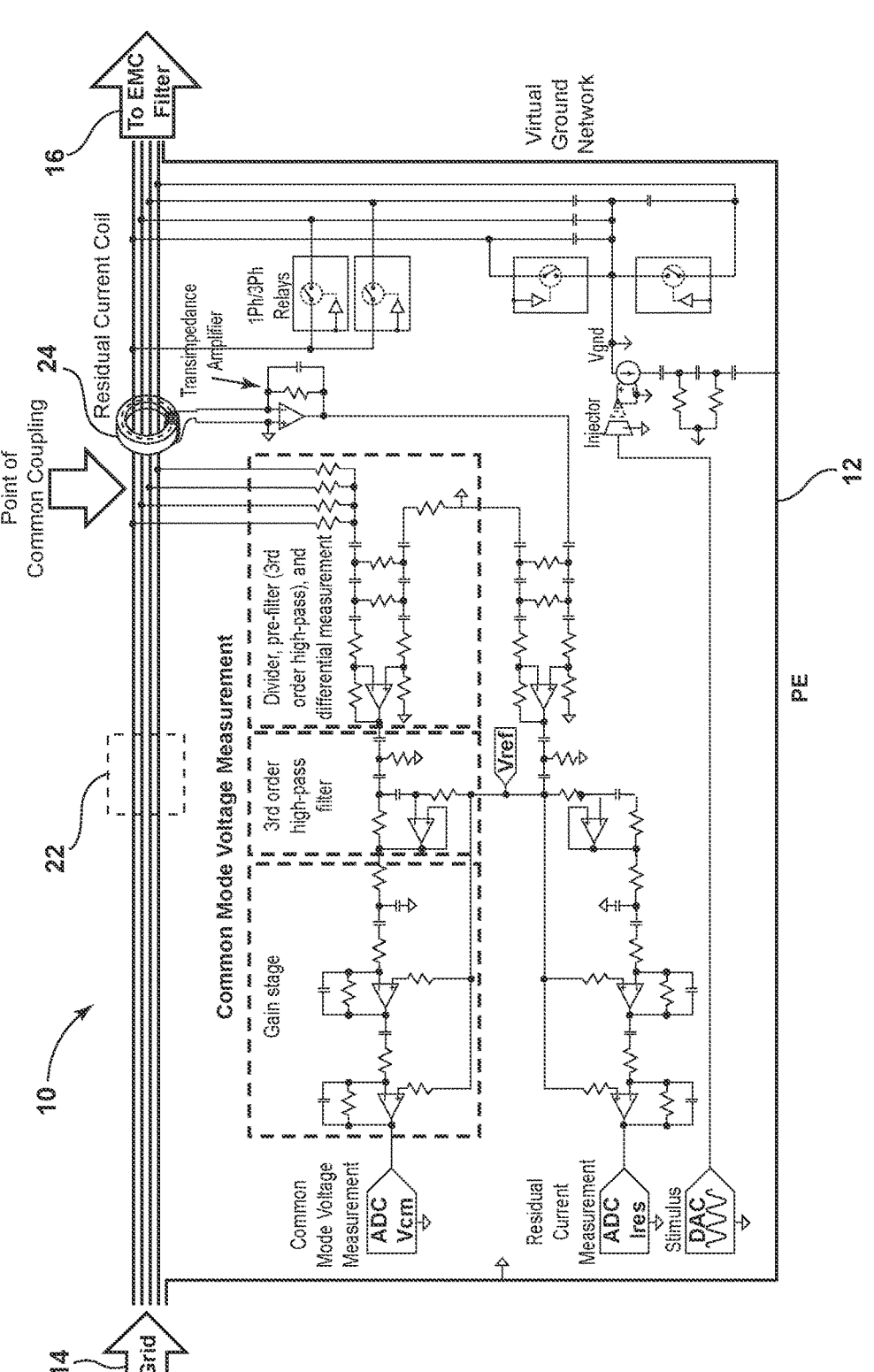
FIG. 3 illustrates the electrical protection circuit of FIG. 1 including a gain stage, high pass filter, and voltage divider for a common mode voltage measurement.

The method then includes measuring the common mode voltage at a point of common coupling. The common mode voltage represents the voltage (with respect to ground) that is common to the current carrying wires 22 that electrically connect the grid voltage 14 to the grid-connected device 16. This is distinguished from a differential voltage in the current carrying wires. The point of common coupling (PCC) provides a reference point for analyzing the flow of power through the protective earth circuit 10. As best shown in FIG. 3, the common mode voltage is measured in digital logic by the DSP 20 after the following stages: (a) a voltage divider stage, (b) a high-pass filter stage, and (c) a gain stage. The voltage divider stage limits the residual current drawn by the measurement circuit and reduces the size of the capacitors otherwise required for the common mode voltage measurement. The high-pass filter stage removes larger grid frequency components below 400 Hz in this example and keeps the op-amp output from saturating. Lastly, the gain stage amplifies the resulting signal (for enhanced resolution) for processing by the DSP 20. The resulting frequency-dependent common mode voltage (as output to the DSP) is the vector mean of four phase voltages at the PCC with respect to ground.

In parallel with the voltage measurement, the method includes measuring a residual current in the current-carrying conductors L1, L2, L2, and N. In the illustrated embodiment, the residual current at the PCC is measured via a residual current coil 24. The residual current coil 24 is a current transformer having a toroid-shaped core made of magnetic material, through which the live (L1, L2, L3) and neutral (N) conductors pass. The conductors 22 (L1, L2, L3, N) make up coupled primary windings each with 1-turn, while a single coupled secondary winding, having more turns, is connected to a transimpedance amplifier which converts the secondary winding current to a voltage. The residual current coil 24 senses the difference in current between the live and neutral conductors. In a balanced system, the magnetic fields generated by these currents cancel out, resulting in little to no induction in the residual current coil 24. However, the stimulus current applied to the protective earth conductor 12 generates a residual current at the PCC, which induces a signal at the residual current coil 24 that is proportional to this residual current.

Figure 4:
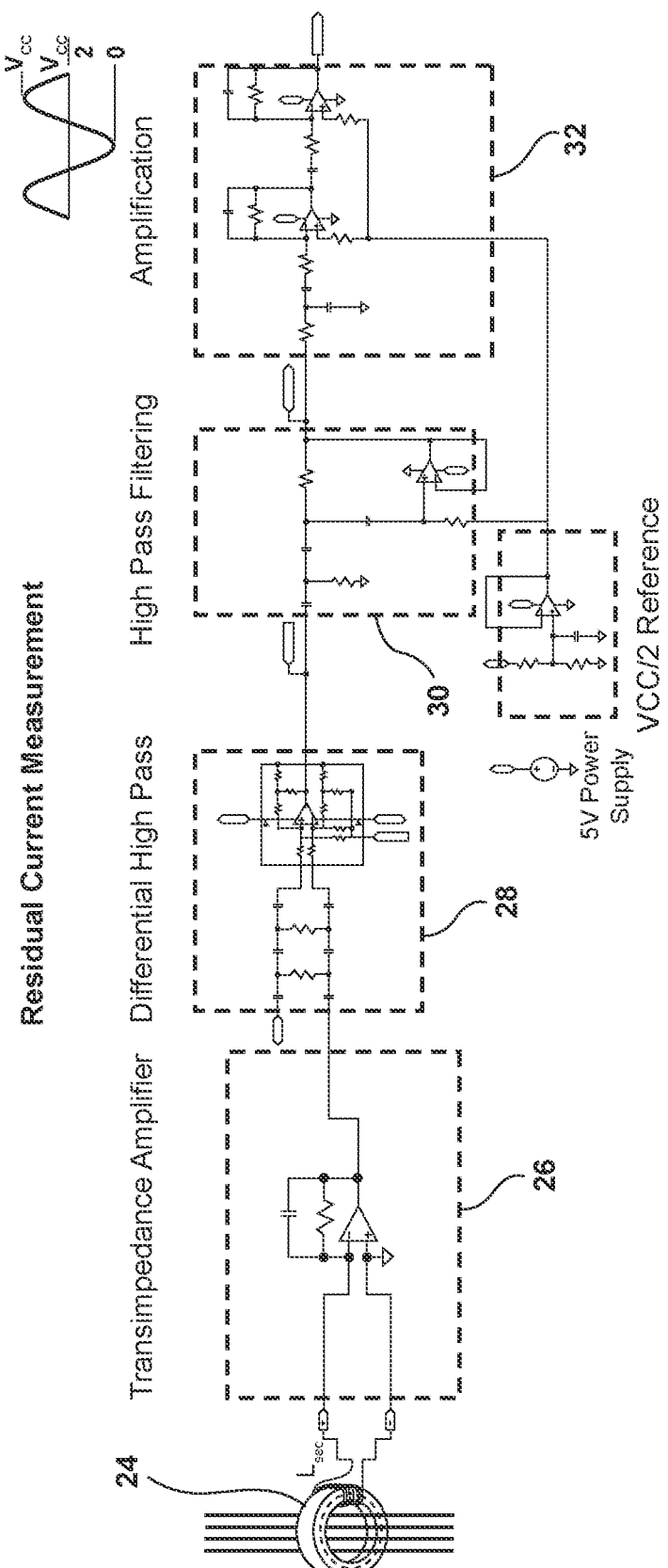
FIG. 4 illustrates an electrical circuit for a residual current measurement at the point of common coupling.

As with the voltage measurement at the PCC, the current measurement at the PCC is subject to high-pass filtering and amplification. As shown in FIG. 4, for example, the residual current coil 24 is electrically coupled to a transimpedance amplifier 26. The transimpedance amplifier 26 converts the input current signal into a proportional output voltage signal. This amplifier 26 possesses a low input impedance and provides a low-resistance path for the input current. The output of the amplifier 26 is processed by a differential high-pass filter 28. The differential high-pass filter 28 includes a differential amplifier having a non-inverting input and an inverting input, thereby allowing high-frequency components to pass while attenuating low-frequency components. Next, a high-pass filter 30 permits signals above a threshold frequency to pass to the DSP 20 with minimal attenuation while attenuating or rejecting signals below that frequency. The current embodiment includes a 400 Hz high-pass filter but can include other high-pass filters in other embodiments as desired. Lastly, the amplitude of the resulting signal is increased at the amplifier stage 32 before being output to the DSP 20.

The method then includes determining an impedance at the point of common coupling based on the measured common mode voltage and the measured residual current. The common mode voltage drops in the current carrying wires due to changes in resistive impedance and changes in reactive impedance. By measuring the residual current and the common mode voltage, the DSP 20 calculates the grid impedance using a vector divide at the specified injected stimulus frequency (fs). This operation generally includes calculating, in digital logic, the trigonometric Fourier coefficients for the common mode voltage ($V_{cm}$) and the residual current ($i_{residual}$) as represented by equations (1) and (2) below:

$$V_{cm}(t) = a\cos(2\pi f_s t) + jb\sin(2\pi f_s t) \qquad (1)$$

$$i_{residual}(t) = c\cos(2\pi f_s t) + jd\sin(2\pi f_s t) \qquad (2)$$

The Fourier coefficients include the complex common mode voltage measurement (a+jb) and the complex residual current measurement (c+jd). The DSP 20 then calculates an uncorrected grid impedance according to the following equation (3):

$$Z_{grid\_uncorrected} = \frac{a + jb}{c + jd} \qquad (3)$$

Using a calibrated correction factor ($Z_{corr}(\text{fs})$) for gain, phase, and analog to digital delay, the corrected grid impedance ($Z_{grid}(\text{fs})$) is then calculated according to the following equation (4):

$$Z_{grid}(f_s) = \frac{(a + jb)V}{(c + jd)A}Z_{corr}(f_s) \qquad (4)$$

The corrected grid impedance ($Z_{grid}(\text{fs})$) includes a resistive component and a reactive component and can be compared with a threshold value. For example, the DSP 20 can compare the line impedance (i.e., the grid impedance) with a threshold value and report a broken PE conductor or a high PE resistance if the line impedance exceeds the threshold value.

If the line impedance exceeds an impedance threshold, the DSP can assume that the ground resistance is unduly large and can generate a corresponding alarm and/or short or deactivate the grid-connected device 16, optionally transmitting the alarm to a remote server 34. The present invention is well suited for a wide range of applications, including both on-board chargers for electric vehicles and standalone charging stations for electric vehicles. While described above in connection with a 3-phase Y connection, the present invention can be applied to any grid connected application, such as three-phase Y electrical systems, three-phase delta electrical systems, U.S. split phase electrical systems, and single-phase electrical systems.

As a further advantage, the system and the method of the present invention measures the actual residual current at the PCC, and therefore need not rely on the injected stimulus current when determining the line impedance. For example, a sneak path may bleed some of the injected current and result in a lower common mode voltage measurement. Alternative methods that do not measure the actual residual current will have a lower accuracy in the computed line impedance. The present system and method overcome this shortcoming, even when there are sneak return paths for the residual current. If the actual current at the injector frequency is too small such that the common mode voltage cannot be measured, the system and the method can respond by adjusting the DSP signal value (amplitude) upward, thereby driving the common mode voltage to a measurable level. This technique ensures sufficient current circulating between the grid and the grid-connected device, regardless of the presence of possible sneak return paths.

The above description is that of current embodiment of the invention. Various alterations and changes can be made without departing from the spirit and broader aspects of the invention. This disclosure is presented for illustrative purposes and should not be interpreted as an exhaustive description of all embodiments of the invention or to limit the scope of the claims to the specific elements illustrated or described in connection with these embodiments. Any reference to elements in the singular, for example, using the articles "a," "an," "the," or "said," is not to be construed as limiting the element to the singular.

The invention claimed is:

1. A method comprising:
   providing a protective earth circuit between a grid voltage and a grid-connected device, the protective earth circuit including a protective earth conductor;
   applying a stimulus current to the protective earth conductor, the stimulus current including a stimulus frequency, the stimulus frequency being greater than a grid frequency;
   measuring a common mode voltage and a residual current at a point of common coupling between the grid voltage and the grid-connected device;
   determining an impedance at the point of common coupling based on the measured common mode voltage and the measured residual current, the impedance including a reactive component and a resistive component; and
   generating an alert in response to the measured impedance at the point of common coupling exceeding a predetermined threshold.

2. The method of claim 1, wherein the grid voltage includes a three-phase electrical supply, a split-phase electrical supply, or a single-phase electrical supply.

3. The method of claim 1, wherein the stimulus frequency is at least an order of magnitude greater than the grid frequency.

4. The method of claim 1, wherein the stimulus frequency at least 1 kHz.

5. The method of claim 1, wherein the stimulus current is applied directly to the protective earth conductor between the grid voltage and the grid-connected device.

6. The method of claim 1, wherein measuring the common mode voltage is performed in digital logic by a digital signal processor after a high-pass filter stage.

7. The method of claim 1, wherein measuring the residual current is performed in digital logic by a digital signal processor after a high-pass filter stage.

8. The method of claim 1, wherein measuring the residual current is performed with a current transformer.

9. The method of claim 8, wherein the current transformer includes a toroid extending around current carrying wires coupled to each of the grid voltage and the grid-connected device.

10. The method of claim 1, wherein determining the impedance at the point of common coupling includes performing a vector divide at the stimulus frequency.

11. The method of claim 10, wherein the vector divide includes a complex common mode voltage measurement divided by a complex residual current measurement and scaled according to a calibrated correction factor for gain, phase, and analog-to-digital delay.

12. The method of claim 1, further including terminating a flow of electrical power to the grid-connected device in response to the measured impedance at the point of common coupling exceeding the predetermined threshold.

13. A system comprising:

a plurality of current carrying wires electrically coupled to a grid voltage and a grid-connected device, each of the grid voltage and the grid-connected device including a protective earth terminal;

a protective earth conductor electrically coupled to the protective earth terminal of the grid voltage and the protective earth terminal of the grid-connected device; and a protective earth monitoring circuit for monitoring an impedance of the protective earth conductor, the protective earth monitoring circuit comprising:

a stimulus injector that is configured to apply a stimulus current to the protective earth conductor, the stimulus current including a stimulus frequency, the stimulus frequency being greater than a frequency of the grid voltage, a measurement circuit for measuring a common mode voltage and a residual current in the plurality of current carrying wires; and a processor coupled to the output of the measurement circuit, the processor being configured to calculate the impedance of the protective earth conductor based on the measured common mode voltage and the measured residual current.

14. The system of claim 10, wherein the stimulus injector comprises an electrical circuit that is adapted to convert a digital signal from the processor into the stimulus current applied directly to the protective earth conductor, the stimulus frequency being equal to or greater than 1 kHz.

15. The system of claim 10, wherein the measurement circuit includes a current transformer having a toroid extending around the plurality of current carrying wires.

16. The system of claim 10, wherein the grid voltage includes a three-phase electrical supply, a split-phase electrical supply, or a single-phase electrical supply.

17. The system of claim 10, wherein the grid-connected device includes an electric vehicle.

18. The system of claim 10, wherein calculating the impedance of the protective earth conductor includes performing a vector divide at the stimulus frequency, and wherein performing the vector divide includes a complex common mode voltage measurement divided by a complex residual current measurement.

19. The system of claim 10, wherein the processor is further configured to perform one or both of the following: (a) generate an alert in response to the calculated impedance exceeding a predetermined threshold; and (b) terminating a flow of electrical power to the grid-connected device.

* * * * *